United States Patent [19]

Sasaki

[11] Patent Number: 4,553,105
[45] Date of Patent: Nov. 12, 1985

[54] MULTISTAGE LINEAR AMPLIFIER FOR A WIDE RANGE OF INPUT SIGNAL LEVELS

[75] Inventor: Susumu Sasaki, Fujisawa, Japan

[73] Assignee: Fujitsu Limited, Kawasaki, Japan

[21] Appl. No.: 575,275

[22] Filed: Jan. 30, 1984

[30] Foreign Application Priority Data

Jan. 31, 1983 [JP] Japan .................................. 58-14407

[51] Int. Cl.⁴ .......................... H03G 7/06; H04B 7/08
[52] U.S. Cl. ..................................... 330/145; 330/51; 330/147; 330/149; 330/284; 455/134; 455/136; 455/249; 455/250
[58] Field of Search ................. 330/51, 133, 144, 145, 330/147, 149, 284; 333/14; 455/133–136, 249, 250

[56] References Cited

U.S. PATENT DOCUMENTS 2,948,860 8/1960 Affelder ............................ 333/14 X
4,035,728 7/1977 Ishikawa et al. ..................... 455/134

Primary Examiner—James B. Mullins
Attorney, Agent, or Firm—Staas & Halsey

[57] ABSTRACT

A multistage amplifier with a low noise figure linearly amplifies an input signal having a level which varies over a wide range. The first stage of the amplifier provides a low noise figure and sufficient power gain to ensure overall low noise performance. An interstage amplifier is protected from saturation by first and second variable attenuators, which are controlled by a level detector. The level detector detects the level of the input or output signal of the interstage amplifier and controls the forward bias current of a diode in each of the variable attenuators. The first variable attenuator functions as a level compressor for signals input to the interstage amplifier having a level higher than a preset level. The second variable attenuator functions as a level expander of the output signal from the interstage amplifier to equalize the signal level compressed by the first variable attenuator. By combining the two variable attenuators, it is possible to provide a multistage amplifier with an extended range of linear operation and which has low noise characteristics.

21 Claims, 12 Drawing Figures

MULTISTAGE LINEAR AMPLIFIER FOR A WIDE RANGE OF INPUT SIGNAL LEVELS

BACKGROUND OF THE INVENTION

This invention relates to a high quality amplifier circuit for telecommunication equipment, more particularly to a multistage amplifier circuit providing a linear input-output characteristic for an input signal having a level which varies over a wide range.

When a multistage amplifier circuit is used in a circuit in which the input signal level varies widely, its output level must be linear over a range which extends up to the highest possible level of the input signal. In addition, an amplifier circuit used in transmission equipment is generally required to have low noise characteristics for the lowest level of the input signal. A circuit of low cost and small size is of course desirable. A typical application for such a multistage amplifier circuit is a microwave receiver in a radio relay system.

A microwave receiver is generally composed of a first stage amplifier for the radio frequency signal, an interstage amplifier for the intermediate frequency signal and a last stage amplifier for the final intermediate frequency signal. FIG. 1 is a block diagram of a multistage amplifier circuit which includes a first stage amplifier 1, an interstage circuit 2 and a last stage amplifier 3. The first stage amplifier 1 is a radio frequency amplifier (RFA). the interstage circuit 2 consists of a frequency mixer (MIX) 21, a local oscillator (LOSC) 22 and an intermediate frequency pre-amplifier (IFA) 23. The last stage amplifier 3 is a main intermediate frequency amplifier (MIFA).

A radio frequency signal $P_1$ from a receiving antenna (not shown) is applied to the radio frequency amplifier (RFA) 1. The output signal $P_2$ of the radio frequency amplifier 1 is mixed with the output of the local oscillator (LOSC) 22 in the frequency mixer (MIX) 21. In the frequency mixer 21, the input signal $P_2$ with frequency $f_r$ is converted into an intermediate frequency signal with frequency $f_{if}$. Frequency $f_{if}$ is the frequency difference between the input signal frequency $f_r$ and the local oscillator frequency $f_{loc}$, and frequency $f_{if}$ is often selected to be 70 MHz.

The input level of the input signal $P_1$ often fluctuates in a wide range from its standard level, a phenomenon which is called "fading". Fading is caused by a change in meteorological conditions along the propagation path of the radio wave. The multistage amplifier in a microwave receiver is required to have a linear input-output characteristic up to the highest level of the input signal $P_1$ caused by fading, as well as to have low noise at the lowest level of the input signal $P_1$.

In the conventional receiver circuit of FIG. 1, the first stage circuit (RFA) 1 of the multistage amplifier circuit is required to be a low noise and high gain amplifier to provide an overall low noise receiver. Thus, when the input signal of RFA 1 attains a high level due to fading, the output signals of the frequency mixer (MIX) 21 and pre-amplifier (IFA) 23 will be saturated or distorted. In order to avoid saturation of the signal in the mixer 21 or pre-amplifier 23 of a conventional multistage amplifier, it has been necessary to use expensive circuitry and components.

SUMMARY OF THE INVENTION

An object of the present invention is to provide an economical multistage amplifier having a linear input-output characteristic and a low noise characteristic for input signal levels which vary over a wide range.

The above object can be achieved by a multistage amplifier in which the first stage is designed to have a low noise figure and a high power gain to provide overall low noise characteristics. The interstage amplifier is designed to have a moderate noise figure and a moderate power gain, sufficient to prevent deterioration of the overall noise figure due to the noise of the last stage amplifier. At the input and output of the interstage amplifier, first and second variable attenuators are respectively provided to achieve a linear input-output characteristic over a wide range of input signal levels. A level detector controls the first and second attenuators so that the first variable attenuator begins to increase its attenuation and the second variable attenuator begins to decrease its attenuation when the level detector detects a preset level of the signal at the input or output of the interstage circuit. The attenuation of the first variable attenuator is maintained complementary to that of the second variable attenuator.

The first variable attenuator works as a level compressor for signals from the first stage amplifier which are higher than a preset level. The second variable attenuator works as a level expander for the signal from the interstage amplifier to compensate for the compression by the first variable attenuator. By the combined operation of the first and second variable attenuators, it is possible to avoid saturation of the signal in the interstage circuit for input signals higher than the preset level and to achieve the object of extending the range of linearity of the input-output characteristic of a multistage amplifier circuit, while maintaining low noise performance.

This object, together with other objects and advantages which will be subsequently apparent, resides in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
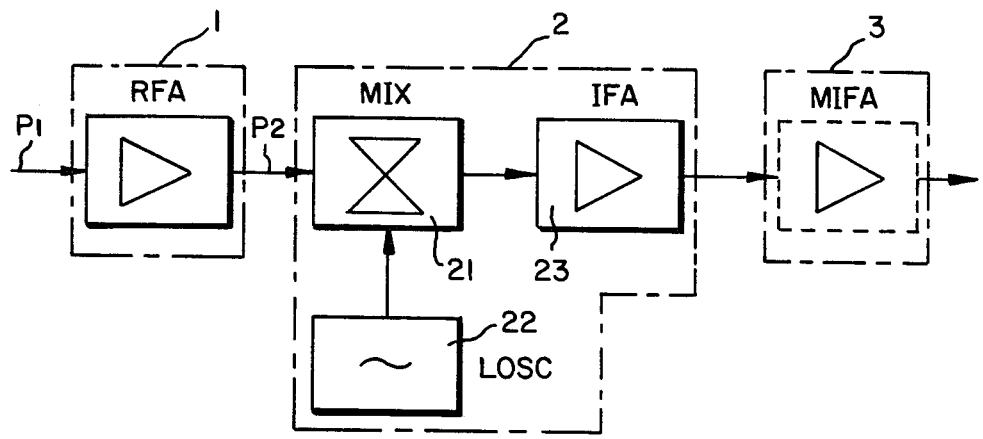
FIG. 1 is a block diagram of a conventional frequency converter type multistage amplifier.
Figure 2:
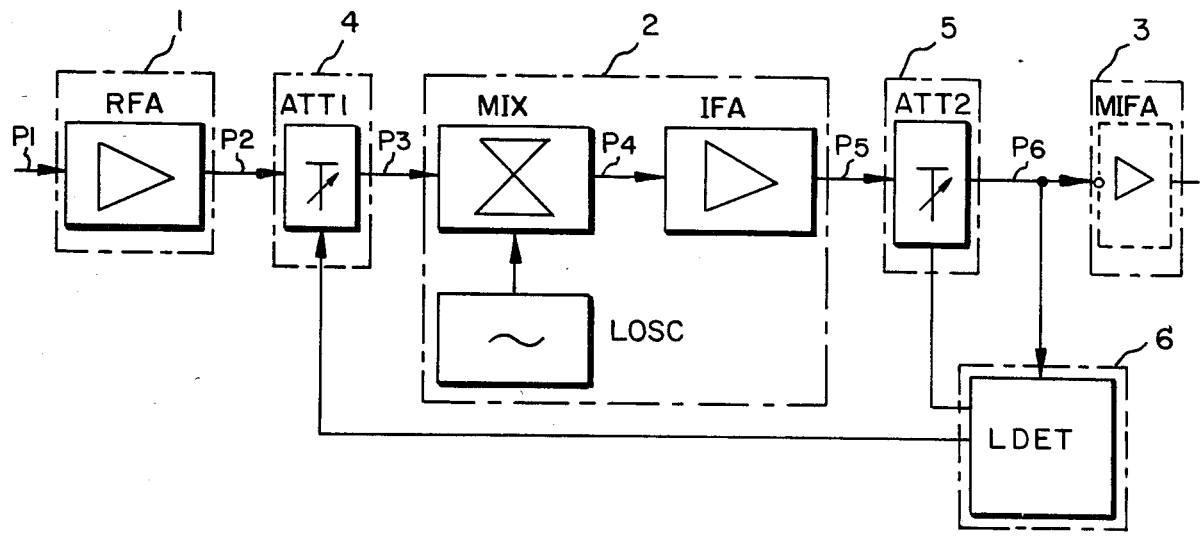
FIG. 2 is a block diagram of a preferred embodiment of a frequency converter type multistage linear amplifier according to the present invention.
Figure 3:
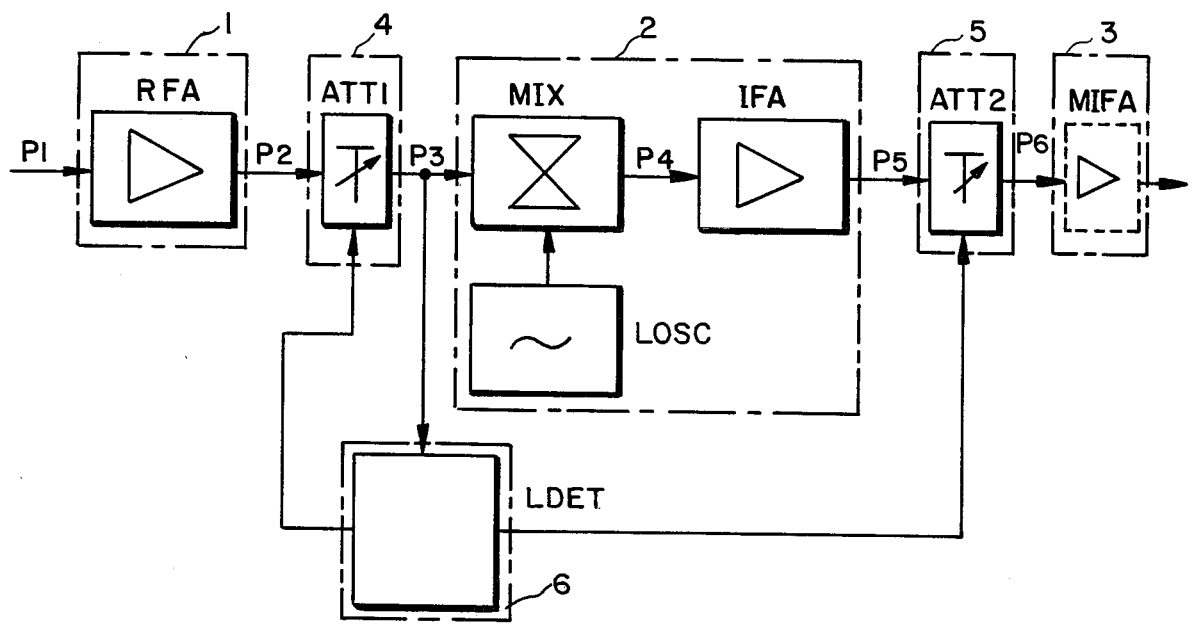
FIG. 3 is a block diagram of another preferred embodiment of a frequency converter type multistage linear amplifier according to the present invention.

FIGS. 2 and 3 are block diagrams of embodiments of a frequency converter type multistage linear amplifier, according to the present invention. In both FIG. 2 and FIG. 3 a first variable attenuator (ATT1) 4 is inserted between the first stage amplifier 1 and the interstage circuit 2 and a second variable attenuator (ATT2) 5 is inserted between the interstage circuit 2 and last stage amplifier 3. A level detector (LDET) 6 outputs control signals to both the first variable attenuator 4 and the second variable attenuator 5. In the embodiment of FIG. 2, the input to the level detector 6 is the output signal $P_6$ of the second variable attenuator 5, and in the embodiment of FIG. 3, the input to the level detector 6 is the input signal $P_3$ of the interstage circuit 2.

The input signal $P_1$ of the first stage amplifier (RFA) 1 varies in level over a wide range from the lowest level $P_{1L}$ to the highest level $P_{1H}$. The levels $P_{1L}$ and $P_{1H}$ of the input signal $P_1$ indicate the transmission quality which is considered in the design of a multistage linear amplifier circuit. Level $P_{1p}$ is the standard level of input signal $P_1$ when fading of the input signal is negligible. Similarly, $P_{iL}$ and $P_{iH}$, where i is a numeral between 2 and 6, are the lowest and highest levels, respectively, for the output signals $P_2$ through $P_6$ of the radio frequency amplifier (RFA) 1, first attenuator (ATT1) 4, frequency mixer or converter (MIX) 21, intermediate frequency pre-amplifier (IFA) 23, and second attenuator (ATT2) 5, respectively.

The input signal $P_1$ is amplified by the first stage amplifier 1 to produce an output signal $P_2$, which varies from $P_{2L}$ to $P_{2H}$, corresponding to the input levels $P_{1L}$ to $P_{1H}$. The first stage amplilier (RFA) 1 has a low noise figure designed to meet the overall noise specification at the lowest level $P_{1L}$. The gain of the first stage amplifier 1 is sufficient to be able to neglect the deterioration of the overall noise figure due to the noise of subsequent stages.

The output signal $P_2$ of first stage amplifier 1 is input to the first variable attenuator (ATT1) 4. The first variable attenuator 4 is controlled by the level detector (LDET) 6 to have minimum attenuation when the level of signal $P_2$ is less than the level $P_{2p}$ which approximately corresponds to the standard level $P_{1p}$. The level $P_{2p}$ is pre-determined in connection with a level $P_{3p}$, the limiting level of the input signal to the mixer circuit (MIX) 21 which avoids saturation in the frequency mixer 21. When the level of signal $P_2$ exceeds the level $P_{2p}$, the attenuation of the first variable attentuator 4 is increased under control of the level detector 6 from its minimum attenuation. As a result, the level of the output signal $P_3$ of the first variable attenuator 4, corresponding to input levels from $P_{2p}$ to $P_{2H}$, is held at a constant level $P_{3p}$. In other words, the level of the output signal $P_3$ of the first variable attenuator 4 varies from $P_{3L}$ to $P_{3p}$, corresponding the variation of the input signal $P_1$ from $P_{1L}$ to $P_{1H}$.

The output signal $P_3$ of first variable attenuator 4 is input to the frequency mixer (MIX) 21, and is mixed with the output of the local oscillator (LOSC) 22 to produce an intermediate frequency signal $P_4$. Conversion from a radio frequency signal to an intermediate frequency signal causes a level loss, but saturation of the frequency mixer 21 does not occur, and linearity is maintained since the highest level of signal $P_3$ is limited to the specified level $P_{3p}$, which is the maximum level which guarantees linear conversion. The level of the output signal $P_4$ of the frequency mixer 21 varies from level $P_{4L}$ to level $P_{4p}$ in dependence upon the level of signal $P_3$ which varies from level $P_{3L}$ to level $P_{3p}$. The output signal $P_4$ of frequency mixer 21 is input to the pre-amplifier (IFA) 23 which generates an output signal $P_5$. The level of the output signal $P_5$ varies from $P_{5L}$ to $P_{5p}$ as signal $P_4$ varies from levels $P_{4L}$ to $P_{4p}$. The signal $P_5$ is applied to the second variable attenuator (ATT2) 5.

The second variable attenuator 5 is controlled by a DC current generated by the level detector 6. In FIG. 2, the DC current generated by the level detector 6 is proportional to the DC voltage of the output signal $P_6$ of the second variable attenuator 5 which is detected by the level detector 6. Until the DC voltage detected by the level detector 6 reaches a preset DC voltage, the attenuation of the second variable attenuator 5 is controlled to remain at a constant attenuation $A_{2max}$. The preset DC voltage corresponds to the level $P_{6p}$ of signal $P_6$ which corresponds to the level $P_{3p}$ of signal $P_3$ input to the frequency mixer 21. The maximum attenuation $A_{2max}$ of second variable attenuator 5 and the maximum attenuation $A_{1max}$ of the first variable attenuator 4 are equal and are designed to be the difference between the highest level $P_{1H}$ and the standard level $P_{1p}$ of input signal $P_1$.

If the DC voltage of signal $P_6$ detected by the level detector 6 exceeds the DC voltage corresponding to the level $P_{6p}$, the second variable attenuator 5 is controlled to reduce its attenuation from its maximum attenuation $A_{2max}$. The second variable attenuator 5 reduces its attenuation in proportion to increments in the level of signal $P_6$ for signal levels between $P_{6p}$ and $P_{6H}$. At the highest level ($P_{6H}$), the attenuation of the second variable attenuator 5 is a minimum attenuation $A_{2min}$, which is practically zero attenuation. Since the first variable attenuator 4 and the second variable attenuator 5 are simultaneously controlled by the level detector 6, the compression of signal $P_2$ from levels between $P_{2p}$ and $P_{2H}$ by the first variable attenuator 4 matches the expansion of signal $P_6$ between levels $P_{6p}$ and $P_{6H}$.

Figure 8:
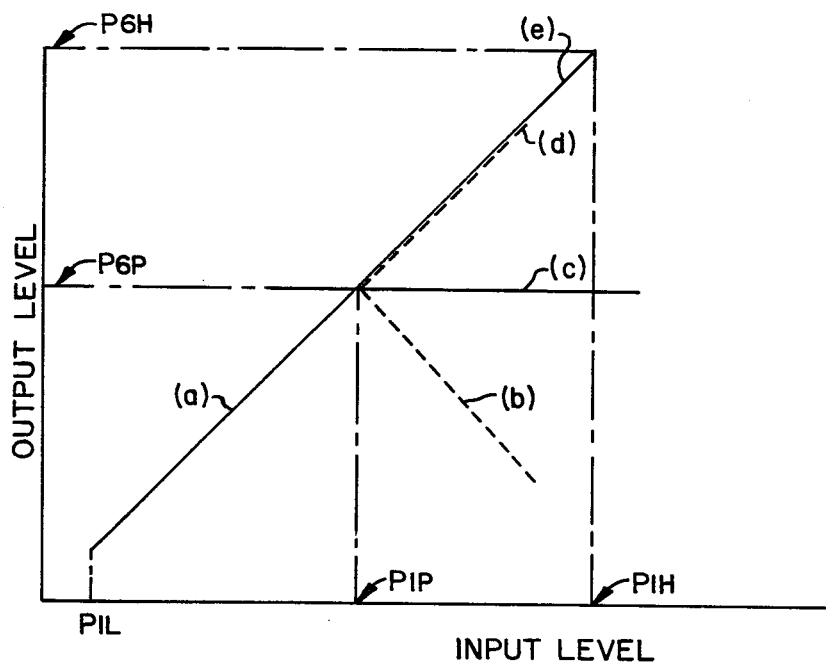
FIG. 8 is a graph of input signal level vs. output signal level of the multistage linear amplifier of FIG. 2.

The difference between the embodiment of FIG. 2 described above and that of FIG. 3 is that the signal detected by level detector 6 is the output signal $P_3$ of the first variable attenuator 4 in the embodiment of FIG. 3 instead of the output signal $P_6$ of the second variable attenuator 5 as in the embodiment of FIG. 2. It will be clear to one skilled in the art, that the operation of the circuit in FIG. 3 is quite similar to that of FIG. 2. A linear relationship between the level of input signal $P_1$ of the first stage amplifier 1 and the level of output signal $P_6$ of the second variable attenuator 5 is attained by the combined operation of the first variable attenuator 4 and the second variable attenuator 5 as illustrated in FIG. 8.

Figure 4A:
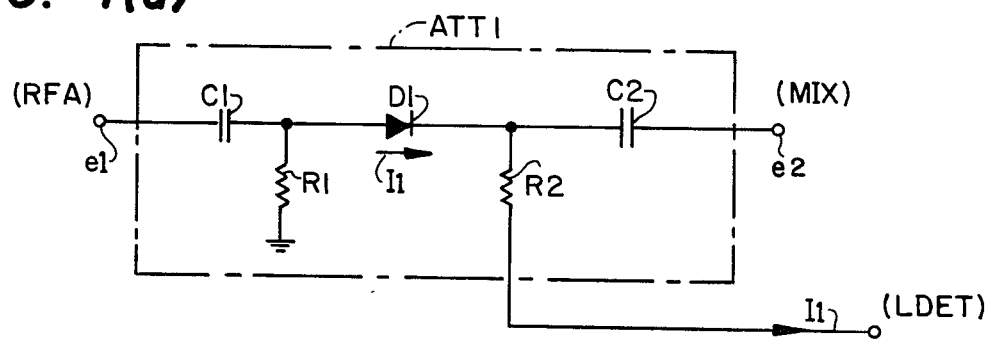
FIGS. 4(a) and 4(b) are circuit diagrams of variable attenuators for the multistage linear amplifier circuit in FIGS. 2 and 3.
Figure 4B:
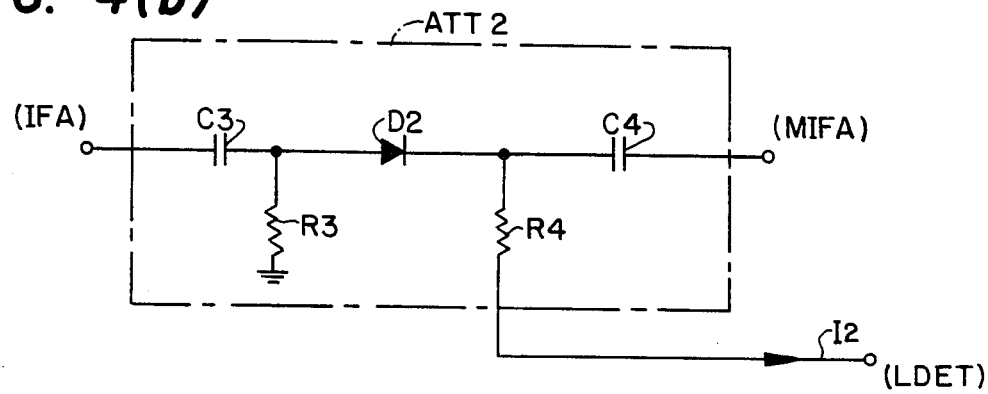

FIGS. 4(a) and 4(b) are circuit diagrams of the first variable attenuator 4 for a radio frequency signal and the second variable attenuator 5 for an intermediate frequency signal, respectively. The circuit configuration and principle of attenuation for the first variable attenuator 4 and the second variable attenuator 5 is the same, but circuit components are different due to the frequency of the input signal. A circuit for the first variable attenuator 4 includes a capacitor C1 for input coupling, a forward bias diode D1, resistors R1 and R2 forming a variable resistance circuit, and a capacitor C2 for output coupling.

The attenuation of first variable attenuator 4, that is the ratio of input level $e_1$ to output level $e_2$, can be determined by the ratio $R2/(r1+R2)$. The attenuation can be controlled by changing the diode resistance r1 of diode D1. The diode resistance r1 is varied by changing the magnitude of the forward current I1 supplied to diode D1. When the forward current I1 is large, diode resistance r1 is small, and the attenuation is small. When forward current I1 is small, diode resistance r1 is large, and the attenuation is large. The forward DC current I1 is supplied by the level detector 6.

Figure 5A:
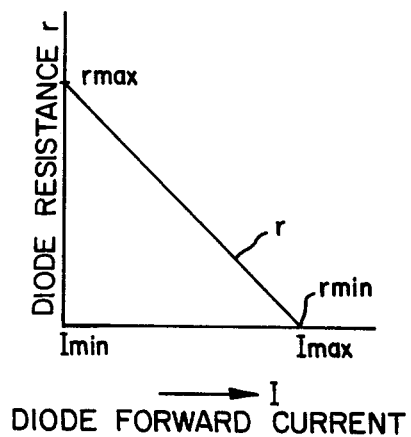
FIG. 5(a) is a graph of the series resistance vs. DC forward bias current characteristic of a diode such as D1 in FIG. 4(a)

FIG. 5(a) is a graph of the characteristic of diode resistance r vs. diode forward current I for an attenuator such as that illustrated in FIG. 4(a). When the forward current I is a minimum $I_{min}$, diode resistance r is a maximum $r_{max}$, and when forward current I is a maximum $I_{max}$, diode resistance r is a minimum $r_{min}$. When the forward current I is decreased, resistance r is increased and the attenuation is increased. When the forward current I is increased, resistance r is decreased and the attenuation is decreased. When the diode resistance r is the maximum $r_{max}$, the attenuation is a maximum $A_{max}$. When the resistance r is the minimum $r_{min}$, the attenuation is a minimum $A_{min}$.

Figure 5B:
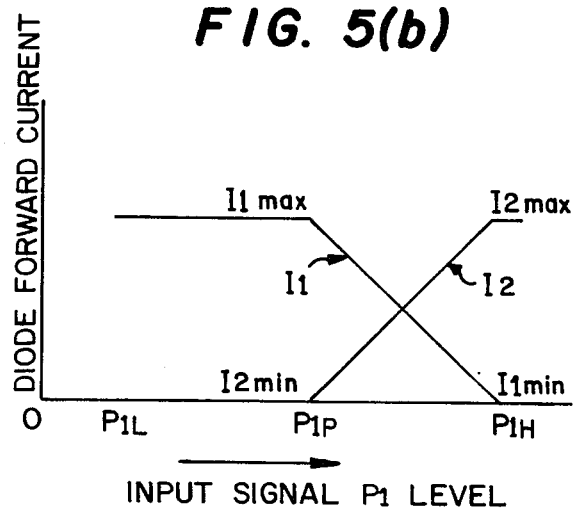
FIG. 5(b) is a graph of diode forward bias current supplied to attenuators ATT1 and ATT2 vs. input signal level of the multistage linear amplifier in FIG. 2.

FIG. 5(b) is a graph of the relationship between the level of the input signal $P_1$ of the multistage amplifier and the currents I1 and I2 supplied to the first variable attenuator 4 and the second variable attenuator 5, respectively. At the preset level $P_{1p}$ of the input signal $P_1$, the DC current I1 begins to decrease and DC current I2 begins to increase. The level of the DC currents I1 and I2, which are respectively supplied to diode D1 of the first variable attenuator 4 and diode D2 of the second variable attenuator 5, are inversely related.

Figure 5C:
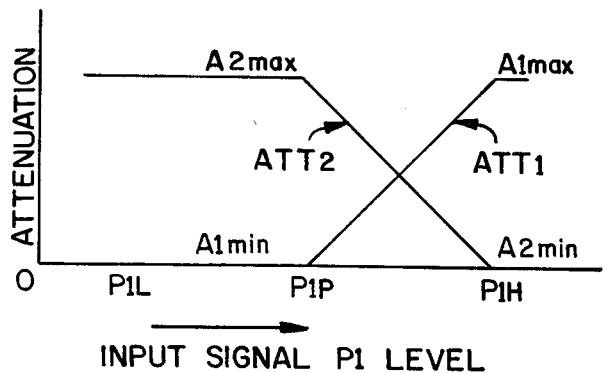
FIG. 5(c) is a graph of the attenuation of attenuators ATT1 and ATT2 vs. input signal level of the multistage linear amplifier of FIG. 2.

FIG. 5(c) is a graph of the mutual relationship of the attenuation of the first variable attenuator 4 and the second variable attenuator 5. When the level of the input signal $P_1$ is less than the standard level $P_{1p}$, the attenuation of the first variable attenuator 4 is held to the minimum attenuation $A_{1min}$, and the attenuation of the second variable attenuator 5 is held to the maximum attenuation $A_{2max}$. When the level of the input signal $P_1$ is higher than the standard level $P_{1p}$, the attenuation of the first variable attenuator 4 is increased, and the attenuation of the second variable attenuator 5 is decreased. When the input signal $P_1$ has the highest level $P_{1H}$, the attenuation of the first variable attenuator 4 reaches the maximum attenuation $A_{1max}$, and the attenuation of the second variable attenuator 5 reaches the minimum attenuation $A_{2min}$. When the level of the input signal $P_1$ is between $P_{1p}$ and $P_{1H}$, the increment of the attenuation of the first variable attenuator 4 over $A_{1min}$ is equal to the decrement of the attenuation of the second variable attenuator 5 under $A_{2max}$.

Figure 6:
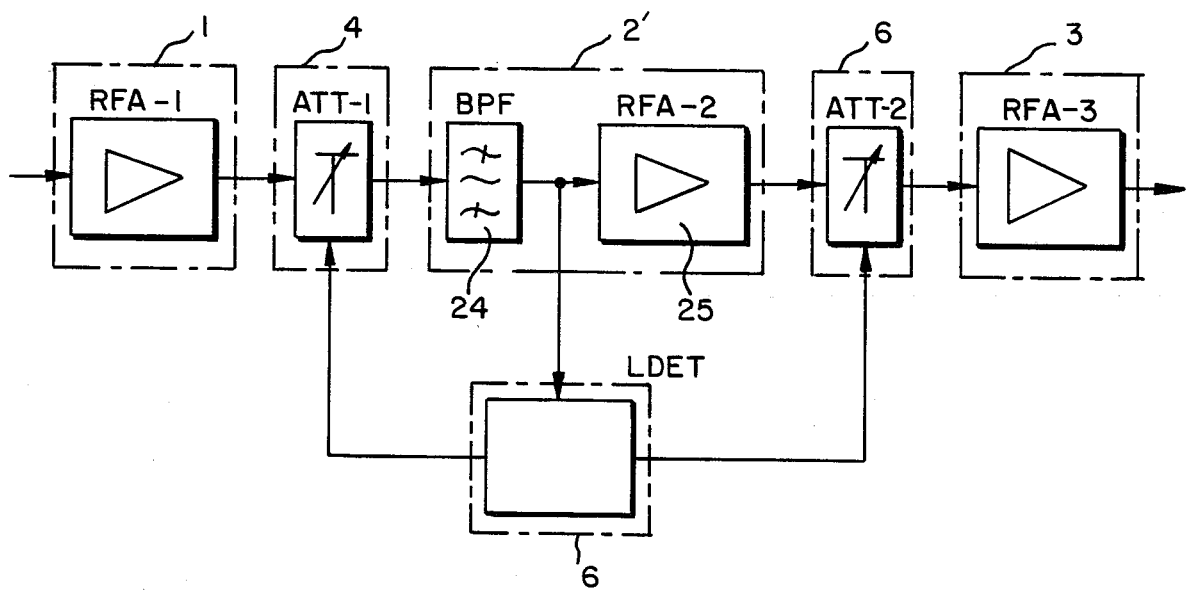
FIG. 6 is a block diagram of an embodiment of a cascaded amplifier type multistage linear amplifier according the present invention.
Figure 7:
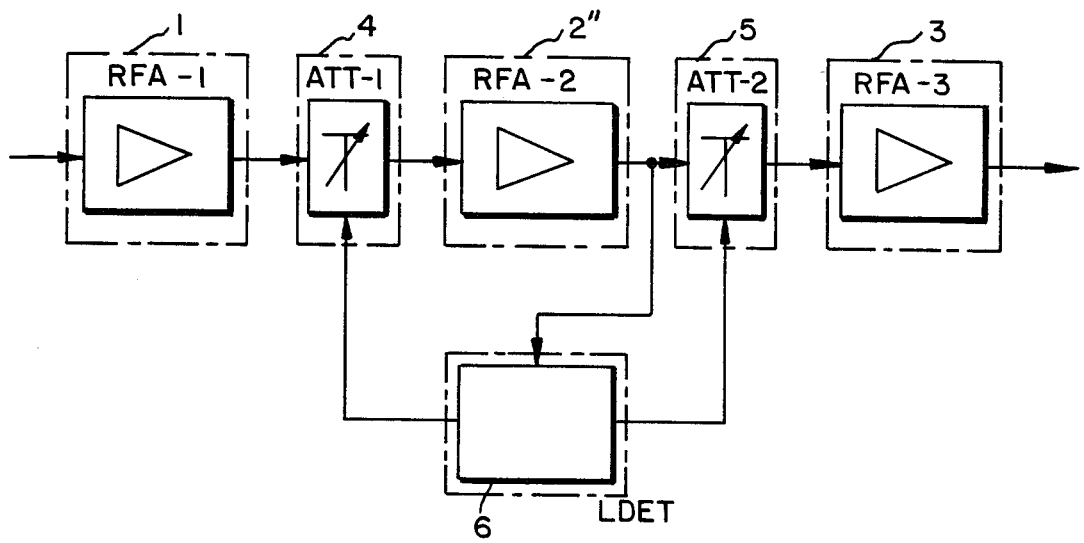
FIG. 7 is a block diagram of another embodiment of a cascaded amplifier type multistage linear amplifier according to the present invention.

Another embodiment of the present invention, applied to a cascaded amplifier type multistage circuit, is illustrated in FIGS. 6 and 7. A cascaded amplifier, as illustrated in the block diagram of FIG. 6, includes a first stage amplifier (RFA-1) 1, a bandpass filter (BPF) 24 and an rf amplifier (RFA-2) 25 in an interstage circuit 2', a last stage amplifier (RFA-3) 3, a first variable attenuator (ATT1) 4, a second variable attenuator (ATT2) 5, and a level detector (LDET) 6.

In the circuit of FIG. 6, the rf amplifier 25 has a low level saturation characteristic, because the rf amplifier 25 is required to be a low noise amplifier in order to reduce the noise due to loss in the bandpass filter 24 which is connected between rf amplifier 1 and rf amplifier 25. A low noise amplifier is generally saturated by a low level signal. The frequency bandwidth of a radio frequency signal is limited by the bandpass filter 24. Insertion loss of the band pass filter 24 is sometimes large.

The first variable attenuator (ATT1) 4, is connected between the first stage amplifier (RFA-1) 1 and the bandpass filter (BPF) 24 of the interstage circuit 2'. The second variable attenuator (ATT2) 5, is connected between rf amplifier 25 in interstage circuit 2' and the last stage amplifier (RFA-3) 3. The level detector (LDET) 6 controls the first and second variable attenuators 4 and 5 by detecting the level of the input to rf amplifier 25. The operation of the first and second variable attenuators 4 and 5 in this circuit is quite similar to that of FIG. 2. By the combined operation of the first and second variable attenuators 4 and 5, saturation of the signal in the rf amplifier 25 can be avoided. Therefore, a linear relationship between the level of the input signal of the first stage amplifier (RFA-1) 1 and the output level of the second attenuator (ATT2) 5 is attained.

In the circuit of FIG. 7, there is no bandpass filter in the interstage circuit 2'', as there is in the interstage circuit 2' of FIG. 6, thereby reducing the cost of the circuit. In addition, the level detector 6 controls the first and second variable attenuators 4 and 5 by detecting the level of the output signal of the interstage amplifier (RFA-2) 2'' instead of its input signal. By the combined operation of the first and second variable attenuators 4 and 5 (in a manner similar to the operation of FIG. 2), it is possible to achieve linear amplification of a cascaded amplifier for an input signal higher than the amplifier's saturation level.

Figure 9:
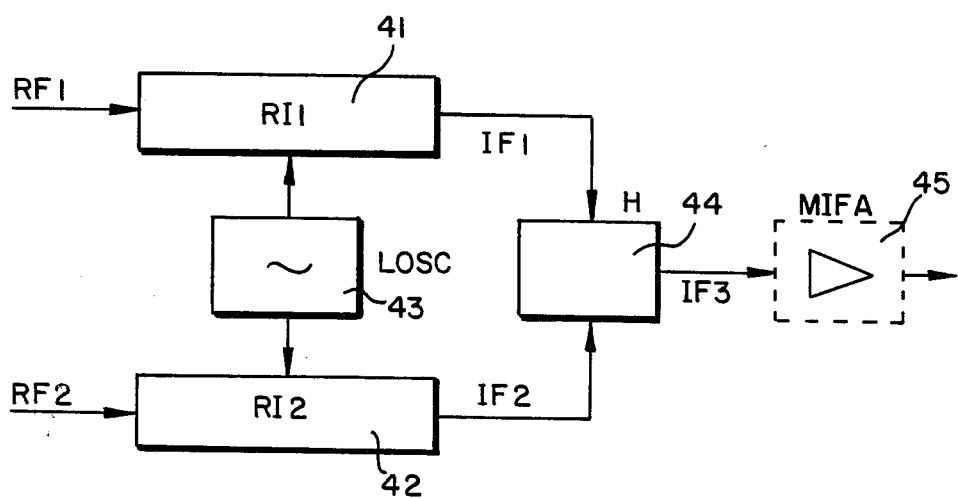
FIG. 9 is a block diagram of a space diversity receiver system using two multistage linear amplifiers of the present invention.

FIG. 9 is a block diagram of a space diversity reception system, using two sets of the frequency converter type multistage linear amplifiers. In FIG. 9, radio frequency signals RF1 and RF2 are input signals from two antennas, each installed separately at different locations or heights. Input signals RF1 and RF2 vary independently of each other over a wide range and are respectively applied to the first stage amplifiers of the multistage linear and low noise receivers (RI1) 41 and (RI2) 42. The signals RF1 and RF2 are frequency converted separately by a common local oscillator (LOSC) 43 to signals with an intermediate frequency. The intermediate frequency signals (P4) are amplified by the preamplifiers of receivers RI1 41 and RI2 42. The output voltages IF1 and IF2 of each of the preamplifiers of receivers RI1 41 and RI2 42, respectively, are input to the circuit (H) 44, which is a switching circuit. The higher voltage of the two output voltages of receivers RI1 41 and RI2 42, is selected in the switching circuit 44, and the output of the switching circuit 44 is input to the main amplifier (MIFA) 45.

For such a space diversity reception system, linear amplification of each multistage receiver circuit is important for a wide range of signal levels. If the receiver RI1 41 or RI2 42 is saturated at the highest level of its input signal, and if the switching or combining of the pre-amplifier output cannot be performed properly, distortion of the output signal is increased significantly. According to the present invention, the problem of saturation of the signal in the mixer and pre-amplifier, can be economically solved by using a multistage linear amplifier.

The relationship of input level and output level of the above described multistage linear amplifiers is illustrated in FIG. 8 with reference to the multistage circuit of FIG. 2. In FIG. 8, the level of the input signal $P_1$ of the first stage amplifier 1 is on the horizontal axis and the level of the output signal $P_6$ of the second variable attenuator 5 is on the vertical axis. The level of the output signal $P_6$ is linear for levels of the input signal $P_1$ between its lowest level $P_{1L}$ and its standard level $P_{1P}$, as indicated by the straight line (a). When the level of the input signal $P_1$ exceeds its standard level $P_{1p}$, the attenuation of the first variable attenuator 4 is increased as in FIG. 5(c) and the level of the output signal $P_3$ from the first variable attenuator 4 is held to a constant level as indicated by the line (c) in FIG. 8. As indicated by the dotted line (b) in FIG. 8, the output level characteristic of the first variable attenuator 4 is inversely proportional to increments in the level of the input signal $P_1$ up to its highest level $P_{1H}$.

At the same time, the second attenuator 5 is controlled to reduce its attenuation from its maximum attenuation $A_{2max}$, so that the increment in the level of the output signal $P_6$ from second variable attenuator 5 is proportional to the increment of the input signal $P_1$, as indicated by the dotted line (d) in FIG. 8. Therefore, the output signal of the second attenuator 5 corresponding to input signal levels of $P_{1p}$ to $P_{1H}$, is expanded linearly from $P_{6p}$ to $P_{6H}$ as indicated by the straight line (e). Thus, a linear relationship between the level of the output signal $P_6$ from the second variable attenuator 5 and the level of the signal $P_1$ input to the first variable attenuator 4 is maintained for the entire range of input signal levels from the lowest level $P_{1L}$ to the highest level $P_{1H}$.

As described above, a multistage amplifier according to the present invention provides a low noise figure and a linear characteristic for input signal levels varying over a wide range. The embodiments described all refer to telecommunication receiving systems, but it will be clear to one skilled in the art that application of the present invention is not limited to telecommunication systems. It can be applied in any system which requires linear amplification of a signal having a level which varies over a wide range.

The many features of the invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, and accordingly, all suitable modifications and equivalents may be resorted to, falling within the scope of the invention.

What is claimed is:

1. A multistage linear amplifier, operatively connected to receive an input signal having a first level which varies over a wide range, comprising:
   first stage amplifying means, operatively connected to receive the input signal, for linearly amplifying the input signal to produce a first amplified signal having a second level;
   level compressor means, operatively connected to said first stage amplifying means, for compressing the second level to produce a compressed signal having a third level;
   interstage amplifying means, operatively connected to said level compressor means, for amplifying the compressed signal to produce a second amplified signal having a fourth level;
   level expander means, operatively connected to said interstage amplifying means, for expanding the fourth level to produce an expanded signal having a fifth level; and
   level detecting means, operatively connected to said level compressor means and said level expander means, for detecting the third level and for controlling said level compressor means and said level expander means so that the expanding of said level expander means complements the compressing of said level compressor means and the input signal is amplified linearly to produce the expanded signal over all of the wide range of the first level.

2. A multistage linear amplifier as recited in claim 1, wherein said level compressor means and said level expander means have a compression ratio and an expansion ratio, respectively, and wherein the expansion ratio is inversely proportional to the compression ratio and is proportional to increments in the third level detected by said level detecting means beyond a preset signal level.

3. A multistage linear amplifier as recited in claim 2, wherein said interstage amplifying means has a saturation level and wherein the preset signal level corresponds to the saturation level of said interstage amplifying means.

4. A multistage linear amplifier as recited in claim 2, wherein said level compressor means comprises a first attenuator, operatively connected to said first stage amplifying means, said interstage amplifying means and said level detecting means, having a first attenuation factor which corresponds to the compression ratio, and
   wherein said level expander means comprises a second attenuator, operatively connected to said interstage amplifying means and said level detecting means, having a second attenuation factor which corresponds to the expansion ratio and is inversely porportional to the first attenuation factor.

5. A multistage linear amplifier as recited in claim 4, wherein said level detecting means generates first and second forward bias currents for controlling said level compressor means and said level expander means, respectively,
   wherein said first attenuator comprises a first diode, operatively connected to said first stage amplifying means, said interstage amplifying means and said level detecting means, controlled by the first forward bias current from said level detecting means, and
   wherein said second attenuator comprises a second diode, operatively connected to said interstage amplifying means and said level detecting means, controlled by the second forward bias current from said level detecting means.

6. A multistage linear amplifier as recited in claim 1, wherein said interstage amplifying means comprises a signal frequency converter circuit, operatively connected to said level compressor means and said level expander means, for converting the frequency of the compressed signal.

7. A multistage linear amplifier as recited in claim 1, wherein said multistage linear amplifier has an overall noise figure and said first stage amplifying means has a low noise figure and an amplification gain which is sufficient to neglect deterioration of the overall noise figure due to noise in the stages of said multistage linear amplifier following said first stage amplifying means.

8. A space diversity receiver system, operatively connected to receive first and second input signals, comprising:

a first multistage linear amplifier comprising:
first initial stage amplifying means, operatively connected to receive the first input signal, for linearly amplifying the first input signal to produce a first initial amplified signal having a first level;
first level compressor means, operatively connected to said first initial stage amplifying means, for compressing the first level to produce a first compressed signal having a second level;
first interstage amplifying means, operatively connected to said first level compressor means, for amplifying the first compressed signal to produce a first intermediate amplified signal having a third level;
first level expander means, operatively connected to said first interstage amplifying means, for expanding the third level to produce a first expanded signal having a fourth level; and
first level detecting means, operatively connected to said first level compressor means and said first level expander means, for detecting the second level and for controlling said first level compressor means and said first level expander means so that the expanding of said first level expander means complements the compressing of said first level compressor means and the first input signal is linearly amplified into the first expanded signal;

a second multistage linear amplifier, comprising:
second initial stage amplifying means, operatively connected to receive the second input signal, for linearly amplifying the second input signal to produce a second initial amplified signal having a fifth level;
second level compressor means, operatively connected to said second initial stage amplifying means, for compressing the fifth level to produce a second compressed signal having a sixth level;
second interstage amplifying means, operatively connected to said second level compressor means, for amplifying the second compressed signal to produce a second intermediate amplified signal having a seventh level;
second level expander means, operatively connected to said second interstage amplifying means, for expanding the seventh level and generating a second expanded signal having an eighth level; and
second level detecting means, operatively connected to said second level compressor means and said second level expander means, for detecting the sixth level and for controlling said second level compressor means and said second level expander means so that the expanding of said second level expander means complements the compressing of said second level compressor means and the second input signal is linearly amplified into the second expanded signal; and switching means, operatively connected to said first and second level expander means, for selecting the higher of the fourth and eighth levels.

9. A multistage linear amplifier, operatively connected to receive an input signal having a first level which varies over a wide range, comprising:
a radio frequency amplifier, operatively connected to receive the input signal, for linearly amplifying the input signal to produce a first amplified signal having a second level;
a first attenuator, operatively connected to said radio frequency amplifier, having a first attenuation factor, for compressing the second level to produce a compressed signal having a third level;
an interstage amplifier circuit, operatively connected to said first attenuator, for amplifying the compressed signal to produce a second amplified signal having a fourth level;
a second attenuator, operatively connected to said interstage amplifier circuit, having a second attenuation factor, for expanding the fourth level to produce an expanded signal having a fifth level; and
a level detector, operatively connected to said first and second attenuators, for detecting the third level, and for controlling said first and second attenuators so that the second attenuation factor is inversely proportional to the first attenuation factor and the input signal is amplified linearly to produce the expanded signal over all of the wide range of the first level.

10. A multistage linear amplifier as recited in claim 9, wherein said level detector generates first and second forward bias currents for controlling said first and second attenuators, respectively,
wherein said first attenuator comprises a first diode, operatively connected to said radio frequency amplifier, said interstage amplifier circuit and said level detector, controlled by the first forward bias current from said level detector, and
wherein said second attenuator comprises a second diode, operatively connected to said interstage amplifier circuit and said level detector, controlled by the second forward bias current from said level detector.

11. A multistage linear amplifier, operatively connected to receive an input signal having a first level which varies over a wide range, comprising:
a first radio frequency amplifier, operatively connected to receive the input signal, for linearly amplifying the input signal to produce a first amplified signal having a second level;
a first attenuator, operatively connected to said first radio frequency amplifier, having a first attenuation factor, for compressing the second level to produce a compressed signal;
a bandpass filter, operatively connected to said first attenuator, for outputting a filtered signal having a third level;
a second radio frequency amplifier, operatively connected to said bandpass filter, for amplifying the filtered signal to produce a second amplified signal having a fourth level;
a second attenuator, operatively connected to said second radio frequency amplifier, having a second attenuation factor, for expanding the fourth level to produce an expanded signal; and a level detector, operatively connected to said first attenuator, said bandpass filter and said second attenuator, for detecting the third level and for controlling the first and second attenuators so that the second attenuation factor is inversely proportional to the first attenuation factor and the input signal is amplified linearly to produce the expanded signal over all of the wide range of the first level.

12. A multistage linear amplifier, operatively connected to receive an input signal having a first level which varies over a wide range, comprising:

first stage amplifying means, operatively connected to receive the input signal, for linearly amplifying the input signal to produce a first amplified signal having a second level;

level compressor means, operatively connected to said first stage amplifying means, for compressing the second level to produce a compressed signal having a third level;

interstage amplifying means, operatively connected to said level compressor means, for amplifying the compressed signal to produce a second amplified signal having a fourth level;

level expander means, operatively connected to said interstage amplifying means, for expanding the fourth level to produce an expanded signal having a fifth level; and level detecting means, operatively connected to said level compressor means and said level expander means, for detecting the fifth level and for controlling said level compressor means and said level expander means so that the expanding of said level expander means complements the compressing of said level compressor means and the input signal is amplified linearly to produce the expanded signal over all of the wide range of the first level.

13. A multistage linear amplifier as recited in claim 12, wherein said level compressor means and said level expander means have a compression ratio and an expansion ratio, respectively, and wherein the expansion ratio is inversely proportional to the compression ratio and is proportional to increments in the fifth level detected by said level detecting means beyond a preset signal level.

14. A multistage linear amplifier as recited in claim 13, wherein said interstage amplifying means has a saturation level and wherein the preset signal level corresponds to the saturation level of said interstage amplifying means.

15. A multistage linear amplifier as recited in claim 13, wherein said level compressor means comprises a first attenuator, operatively connected to said first stage amplifying means, said interstage amplifying means and said level detecting means, having a first attenuation factor which corresponds to the compression ratio, and wherein said level expander means comprises a second attenuator, operatively connected to said interstage amplifying means and said level detecting means, having a second attenuation factor which corresponds to the expansion ratio and is inversely proportional to the first attenuation factor.

16. A multistage linear amplifier as recited in claim 15, wherein said level detecting means generates first and second forward bias currents for controlling said level compressor means and said level expander means, respectively, wherein said first attenuator comprises a first diode, operatively connected to said first stage amplifying means, said interstage amplifying means and said level detecting means, controlled by the first forward bias current from said level detecting means, and wherein said second attenuator comprises a second diode, operatively connected to said interstage amplifying means and said level detecting means, controlled by the second forward bias current from said level detecting means.

17. A multistage linear amplifier as recited in claim 12, wherein said interstage amplifying means comprises a signal frequency converter circuit, operatively connected to said level compressor means and said level expander means, for converting the frequency of the compressed signal.

18. A multistage linear amplifier as recited in claim 12, wherein said multistage linear amplifier has an overall noise figure and said first stage amplifying means has a low noise figure and an amplification gain which is sufficient to neglect deterioration of the overall noise figure due to noise in the stages of said multistage linear amplifier following said first stage amplifying means.

19. A space diversity receiver system, operatively connected to receive first and second input signals, comprising:

a first multistage linear amplifier comprising:

first initial stage amplifying means, operatively connected to receive the first input signal, for linearly amplifying the first input signal to produce a first initial amplified signal having a first level;

first level compressor means, operatively connected to said first initial stage amplifying means, for compressing the first level to produce a first compressed signal having a second level;

first interstage amplifying means, operatively connected to said first level compressor means, for amplifying the first compressed signal to produce a first intermediate amplified signal having a third level;

first level expander means, operatively connected to said first interstage amplifying means, for expanding the third level to produce a first expanded signal having a fourth level; and first level detecting means, operatively connected to said first level compressor means and said first level expander means, for detecting the fourth level and for controlling said first level compressor means and said first level expander means so that the expanding of said first level expander means complements the compressing of said first level compressor means and the first input signal is linearly amplified into the first expanded signal;

a second multistage linear amplifier, comprising:

second initial stage amplifying means, operatively connected to receive the second input signal, for linearly amplifying the second input signal to produce a second initial amplified signal having a fifth level;

second level compressor means, operatively connected to said second initial stage amplifying means, for compressing the fifth level to produce a second compressed signal having a sixth level;

second interstage amplifying means, operatively connected to said second level compressor means, for amplifying the second compressed signal to produce a second intermediate amplified signal having a seventh level;

second level expander means, operatively connected to said second interstage amplifying means, for expanding the seventh level and generating a second expanded signal having an eighth level; and second level detecting means, operatively connected to said second level compressor means and said second level expander means, for detecting the eighth level and for controlling said second level compressor means and said second level expander means so that the expanding of said second level expander means complements the compressing of said second level compressor means and the second input signal is linearly amplified into the second expanded signal; and switching means, operatively connected to said first and second level expander means, for selecting the higher of the fourth and eighth levels.

20. A multistage linear amplifier, operatively connected to receive an input signal having a first level which varies over a wide range, comprising:

a radio frequency amplifier, operatively connected to receive the input signal, for linearly amplifying the input signal to produce a first amplified signal having a second level;

a first attenuator, operatively connected to said radio frequency amplifier, having a first attenuation factor, for compressing the second level to produce a compressed signal having a third level;

an interstage amplifier circuit, operatively connected to said first attenuator, for amplifying the compressed signal to produce a second amplified signal having a fourth level;

a second attenuator, operatively connected to said interstage amplifier circuit, having a second attenuation factor, for expanding the fourth level to produce an expanded signal having a fifth level; and a level detector, operatively connected to said first and second attenuators, for detecting the fifth level and for controlling said first and second attenuators so that the second attenuation factor is inversely proportional to the first attenuation factor and the input signal is amplified linearly to produce the expanded signal over all of the wide range of the first level.

21. A multistage linear amplifier as recited in claim 20, wherein said level detector generates first and second forward bias currents for controlling said first and second attenuators, respectively, wherein said first attenuator comprises a first diode, operatively connected to said radio frequency amplifier, said interstage amplifier circuit and said level detector, controlled by the first forward bias current from said level detector, and wherein said second attenuator comprises a second diode, operatively connected to said interstage amplifier circuit and said level detector, controlled by the second forward bias current from said level detector.

* * * * *